United States Patent [19]

Ignatius et al.

[11] Patent Number: 5,660,461
[45] Date of Patent: Aug. 26, 1997

[54] ARRAYS OF OPTOELECTRONIC DEVICES AND METHOD OF MAKING SAME

[75] Inventors: Ronald W. Ignatius; Todd S. Martin, both of Dodgeville, Wis.

[73] Assignee: Quantum Devices, Inc., Barneveld, Wis.

[21] Appl. No.: 351,813

[22] Filed: Dec. 8, 1994

[51] Int. Cl.$^6$ .......................... F21V 7/02; H01R 43/00; H01L 33/00

[52] U.S. Cl. .......................... 362/241; 362/249; 362/294; 362/346; 362/800; 257/88; 257/98; 257/668; 29/827; 29/856; 29/860; 313/114; 313/500

[58] Field of Search .......................... 228/179.1; 257/88, 257/98, 99, 666, 668, 675, 676, 701, 704, 723, 725; 313/500, 114; 362/800, 240, 241, 247, 249, 226, 294, 250, 346; 29/827, 854, 856, 860

[56] References Cited

U.S. PATENT DOCUMENTS

| | | | |
|---|---|---|---|
| 3,711,789 | 1/1973 | Dierschke | 313/500 |
| 3,764,862 | 10/1973 | Jankowski | 317/234 |
| 3,778,887 | 12/1973 | Suzuki et al. | 29/827 |
| 3,832,480 | 8/1974 | Bunker | 29/827 |
| 4,054,814 | 10/1977 | Fegley | 315/71 |
| 4,129,682 | 12/1978 | Stewart et al. | 428/571 |
| 4,152,624 | 5/1979 | Knaebel | 313/499 |
| 4,157,486 | 6/1979 | Fegley | 315/71 |
| 4,375,606 | 3/1983 | Di Leo et al. | 313/499 |
| 4,486,364 | 12/1984 | Takahashi | 264/1.7 |
| 4,542,259 | 9/1985 | Butt | 174/52 |
| 4,667,277 | 5/1987 | Hanchar | 362/250 |
| 4,742,432 | 5/1988 | Thillays et al. | 362/800 |
| 4,853,593 | 8/1989 | Stein | 313/500 |
| 4,862,586 | 9/1989 | Osada | 29/827 |
| 4,867,371 | 9/1989 | Davis et al. | 228/160 |
| 4,893,169 | 1/1990 | Rusch et al. | 357/70 |
| 4,935,665 | 6/1990 | Murata | 313/500 |
| 5,012,609 | 5/1991 | Ignatius et al. | 47/58 |
| 5,062,818 | 11/1991 | Wasimoto et al. | 445/856 |
| 5,174,649 | 12/1992 | Alston | 362/244 |
| 5,175,060 | 12/1992 | Enomoto et al. | 428/827 |
| 5,241,457 | 8/1993 | Sasajima et al. | 362/80.1 |
| 5,278,432 | 1/1994 | Ignatius et al. | 257/88 |
| 5,289,033 | 2/1994 | Asami et al. | 257/676 |
| 5,404,282 | 4/1995 | Klinke et al. | 362/800 |
| 5,436,809 | 7/1995 | Brassier et al. | 362/800 |

*Primary Examiner*—Alan Cariaso
*Attorney, Agent, or Firm*—Michael, Best & Friedrich

[57] ABSTRACT

A low cost LED array is formed from a plurality of modular units that are snapped together. Each modular unit consists of one or more U-shaped lead frame substrates which are overmolded with a thermoplastic insulator material. The lead frame substrates act as heat dissipators. The LEDs are then bonded onto the upper surfaces of the lead frame substrates. A reflector unit is separately molded and has one cone-shaped reflector for each light emitting diode. The reflector unit is aligned and affixed to the top of the lead frame unit such that the LED is disposed in the center of each cone. Each of the reflector units has several dovetail-shaped connectors which enable the completed module to be connected to adjacent modules to form the array. The modules are then electrically connected together in series or in parallel according to the particular application. The arrays may be used for plant growth or in photodynamic therapy.

37 Claims, 7 Drawing Sheets

ARRAYS OF OPTOELECTRONIC DEVICES AND METHOD OF MAKING SAME

BACKGROUND OF THE INVENTION

The U.S. Government has a paid-up license in this invention and the right in limited circumstances to require the patent owner to license others on reasonable terms as provided for by the terms of Grant No. NASW-4909 awarded by the National Aeronautics and Space Administration.

This invention relates to arrays of optoelectronic devices such as light emitting diodes. More particularly, this invention relates to low cost methods of manufacturing such arrays.

In the past, arrays of light emitting diodes (LEDs) and other optoelectronic devices were primarily used as indicators and in signs. More recently, such arrays have been used as a source of radiant flux. The term "power" is often used interchangeably with the term "radiant flux" when referring to optoelectronic devices. Both radiant flux and power are measured in watts. Several applications of LED arrays in which the LEDs are used as a source of radiant flux include environmental chambers for plant growth and medical applications in photodynamic therapy.

Regardless of whether LED arrays are used as indicators or as a radiant flux source, it is often desirable to provide large scale arrays in some applications. For example, large scale arrays may be used in plant growth in which red and blue LEDs supply the most desirable wavelengths of light energy to large numbers of plants.

There are several problems in using arrays, and particularly large scale arrays, of optoelectronic devices. One problem is the cost of manufacturing the arrays. Prior art LED arrays are expensive to manufacture on a large scale basis because many components and manufacturing steps are required to produce the arrays.

Another problem with prior art LED arrays is the dissipation of the heat generated by the optoelectronic devices. For an LED array to be effective as a radiant flux source, it is often desirable to provide sufficient power to the array so that the light output of the array is equivalent to the output of 1 to 10 suns or more. However, a great deal of heat is generated when the light output of the array is very high. Indeed, the ability to dissipate the heat generated by the LED array is one of the greatest limitations on the total light output of the array.

SUMMARY OF THE INVENTION

A low cost method of manufacturing arrays of optoelectronic devices, such as light emitting diodes, is provided.

In a preferred embodiment of the present invention, the array is manufactured by individually manufacturing a plurality of modules, and then by mechanically and electrically connecting the modules together to form an array of any desired size. The array is then electrically connected to a power source. Each of the modules may have one or more optoelectronic devices. The modules may be connected in parallel or in series to yield any desired configuration or radiant flux output.

The preferred method of manufacturing each module includes forming at least one lead frame substrate, applying an insulator material onto portions of the lead frame substrate by molding or the like to create a lead frame unit, and affixing at least one optoelectronic device onto the lead frame unit. Thereafter, a reflector unit is formed that has at least one reflector, and the reflector unit is affixed to the lead frame unit such that a reflector is disposed adjacent to each optoelectronic device. Each of the lead frame units or the reflector unit is formed with male and female connectors so that adjacent modules may be mechanically connected together to form the array.

The method according to the present invention results in a unique array of optoelectronic devices which is formed from a plurality of interconnected modules. Each of the modules has at least one U-shaped lead frame substrate. If a plurality of lead frame substrates are used in a module, the individual substrates are electrically separated and mechanically held together by the insulator material. At least some of the lead frame substrates have an optoelectronic device disposed on an upper surface thereof. Each device is electrically connected to two lead frame substrates.

The module also has a plurality of registration members that align the reflector unit which is affixed to the upper surface of the lead frame unit. The reflector unit is a molded component that has one reflector for each of the optoelectronic devices in the module. Each of the individual reflectors is coated with a reflective material such as chromium. In a preferred embodiment, each of the reflector units also has connectors affixed thereto which are used to mechanically connect the reflector units of adjacent modules to each other.

Each of the lead frame substrates is made from a metal or metal alloy, and acts as a heat sink that is capable of dissipating a great deal of heat. Thus, the LED array may not require ventilators or water cooling apparatus to dissipate the heat generated by the light emitting diodes.

It is a feature and advantage of the present invention to reduce the cost of manufacturing large scale arrays of light emitting diodes.

It is another feature and advantage of the present invention to provide an array of light emitting diodes that has a high output yet which inexpensively dissipates the heat generated by the array.

It is another feature and advantage of the present invention to allow the LEDs to be driven beyond their typical or rated forward currents by effectively dissipating the heat from the LED array, thereby increasing the radiant flux output of the array with fewer LED components.

These and other features and advantages of the present invention will be apparent to those skilled in the art from the following detailed description of the preferred embodiment and the drawings, in which:

DETAILED DESCRIPTION OF THE PREFERRED EMBODIMENT

Figure 1:
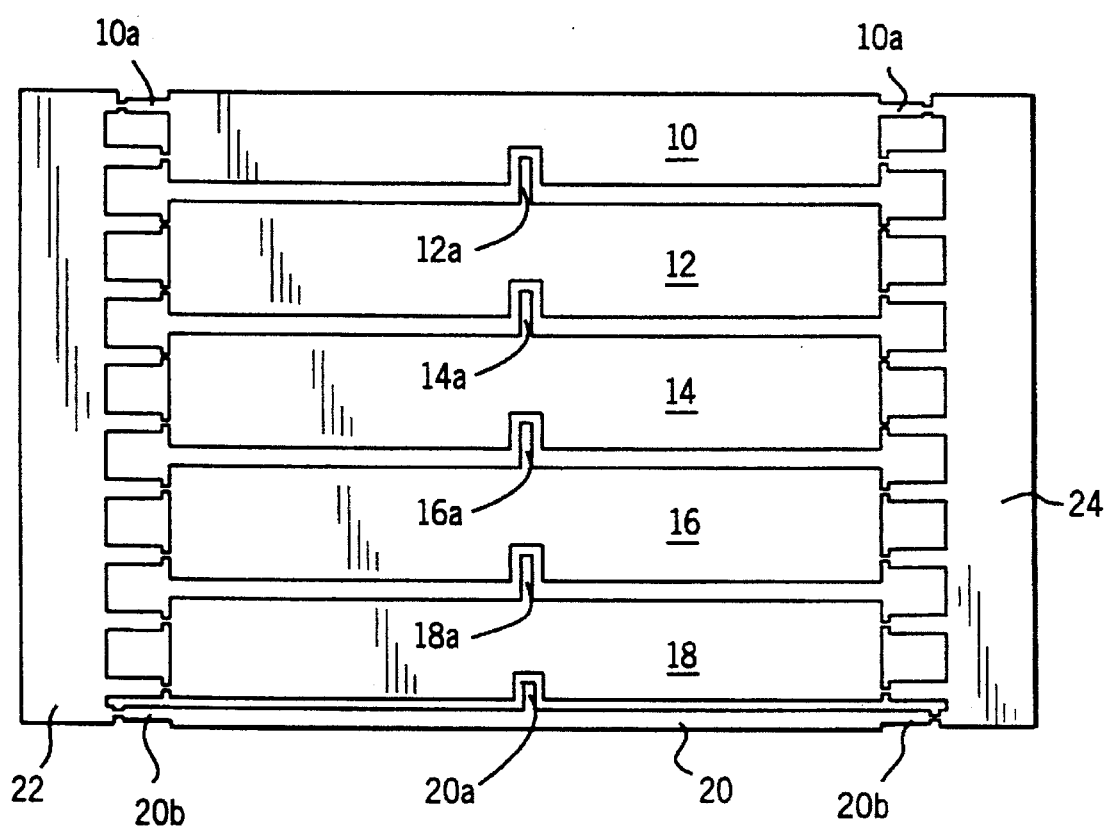
FIG. 1 is a plan view of a plurality of lead frame substrates.

FIG. 1 depicts a plurality of lead frame substrates. Lead frame substrates are made from a highly conductive metal such as copper, aluminum or nickel. Substrates may be manufactured by stamping, laser cutting, or photomilling.

Each of substrates includes an integral protrusion 12a, 14a, 16a, 18a, and 20a respectively that is used as the attachment point for the lead wire from an optoelectronic device on the adjacent lead frame substrate. Substrate 10 does not have such a protrusion.

Substrate 10 has a pair of electrical terminals 10a, both of which are used as either the input terminals of the completed module or the output terminals. Similarly, lead frame substrate 20 has a pair of electrical terminals 20b which may serve as either the output terminals or the input terminals of the complete module. If terminals 10a are connected as the input terminals, then terminals 20b are connected as the output terminals of the module, and vice versa.

Each of lead frame substrates has attached thereto two extra pieces 22 and 24 which are formed during the stamping process.

Figure 2:
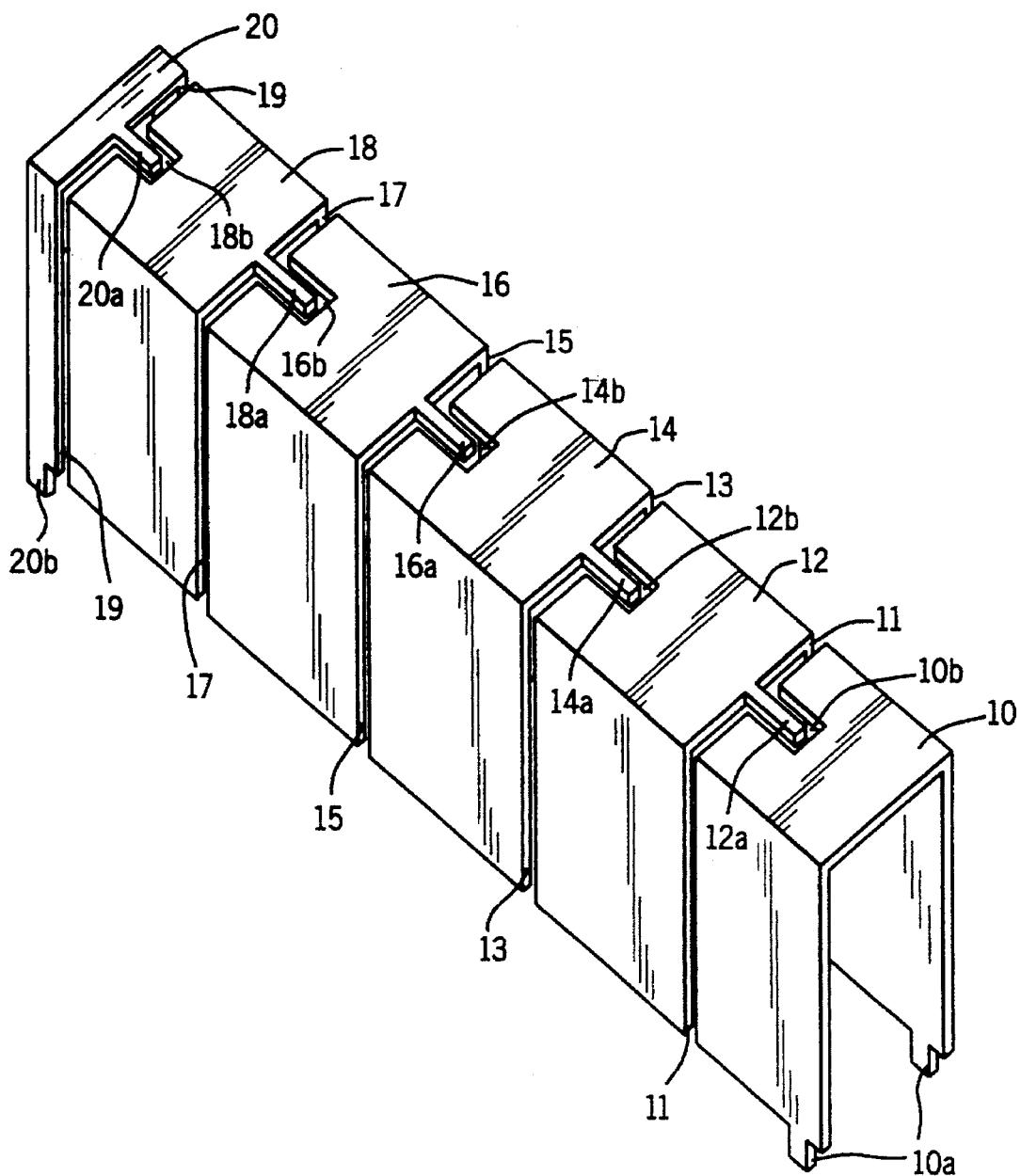
FIG. 2 is a perspective view of a plurality of lead frame substrates after they have been bent into U-shaped members.

The stamped lead frame substrates are then bent into a substantially U-shaped configuration using a press with male and female inserts, and pieces 22 and 24 are removed. The bent lead frame substrates are depicted in FIG. 2. As shown in FIG. 2, adjacent substrates have gaps 11, 13, 15, 17 and 19.

As also shown in FIG. 2, each of protrusions 12a, 14a, 16a, 18a and 20a is received in an indentations 10b, 12b, 14b, 16b and 18b respectively of an adjacent lead frame substrate.

Although the preferred embodiment discussed herein consists of a module having five optoelectronic devices and six lead frame substrates, it is to be understood that the arrays according to the present invention may be manufactured with as few as one lead frame substrate having a single optoelectronic device, as well as with more than five lead frame substrates and optoelectronic devices. The number of substrates and optoelectronic devices in a single module is dependent upon designer's choice, tooling cost, and space and power considerations in the final array.

To improve the electrical connections between the optoelectronic devices and the substrates, it may be desirable to place another electrically-conductive material on top of at least a portion of the uppermost surfaces of substrates. The addition conductive material may be plated onto the uppermost surfaces, it could be spot plated at those locations where the optoelectronic devices and lead wires connect to the substrates, or it could be inlaid where the optoelectronic devices and the lead wires connect to the substrates. The additional conductive material is preferably nickel, gold or silver, although other materials may be used. If copper is used as the primary substrate material, it is particularly desirable to plate another metal where the optoelectronic devices connect to the substrate since it is often difficult to connect the optoelectronic devices to copper, and to create a more reliable metallic connection.

The next step in the manufacturing process is to place an insulator material in gaps 11, 13, 15, 17 and 19 between substrates, as well as around the edges of the substrates. The purpose of the insulator material is to prevent short circuits between the substrates, and between substrates of adjacent modules. Another primary purpose of the insulator material is to hold substrates 10, 12, 14, 16, 18 and 20 together in the module.

Figure 3:
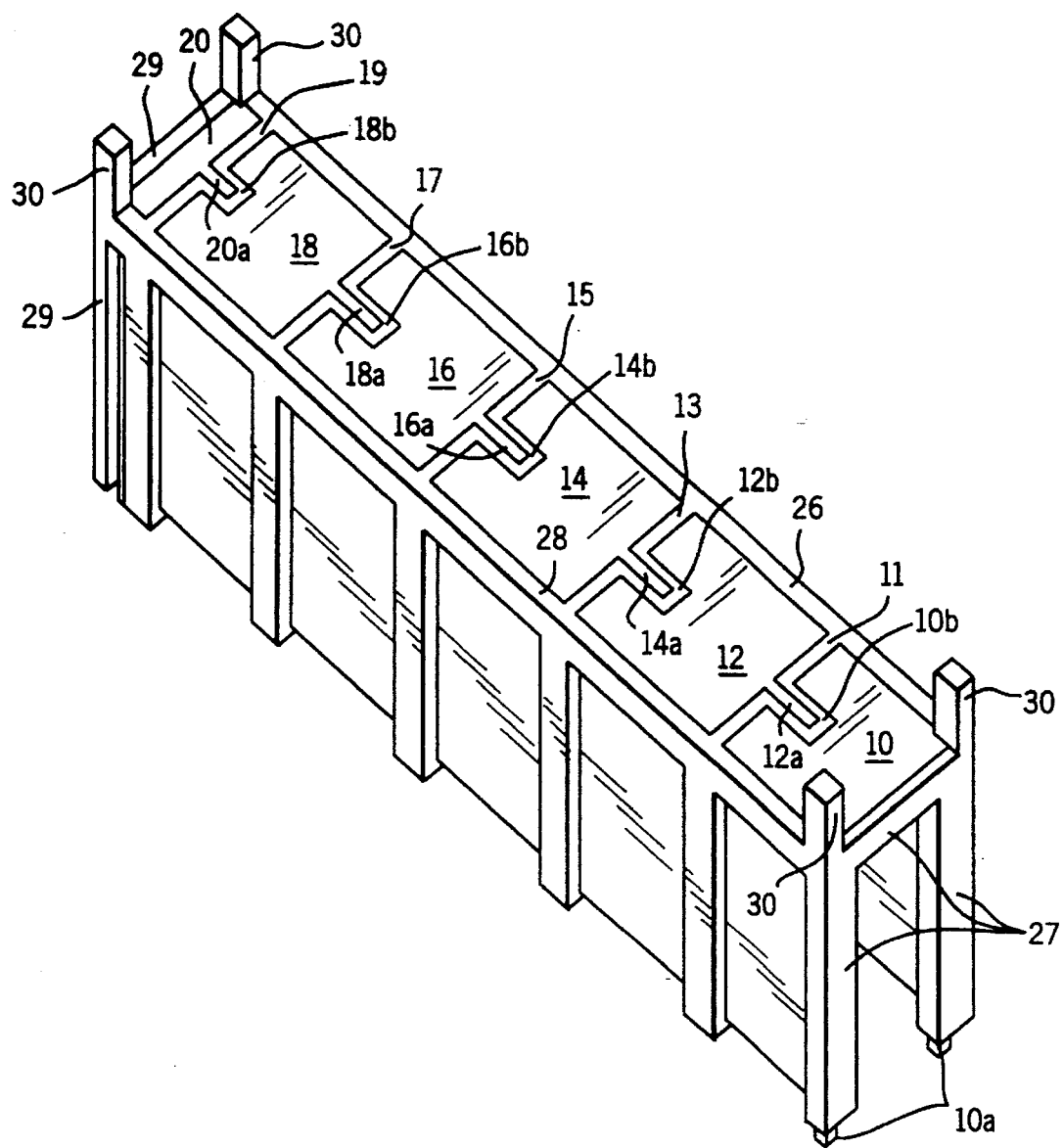
FIG. 3 is a perspective view of the lead frame unit after an insulator material has been applied thereto.
Figure 6:
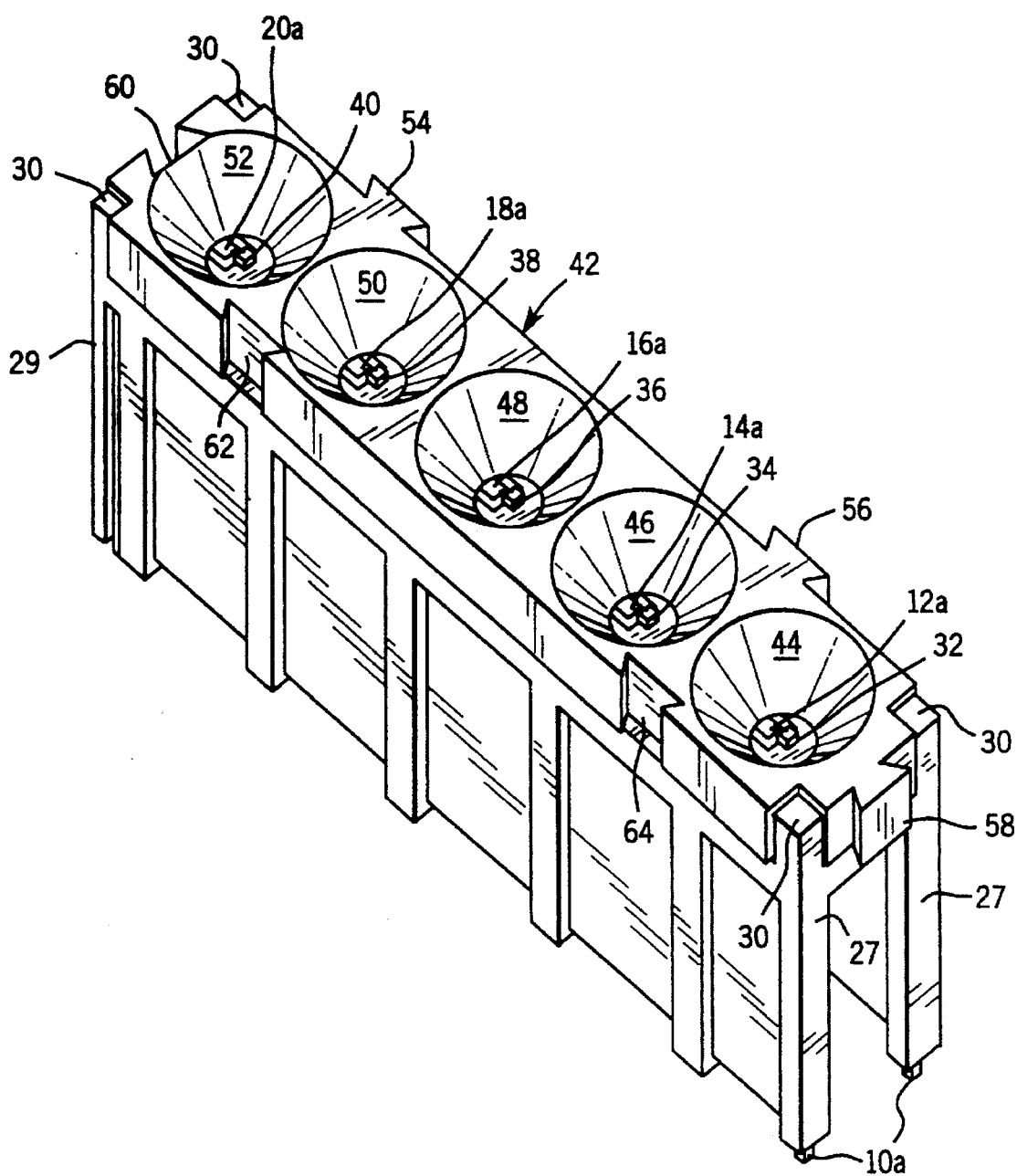
FIG. 6 is a perspective view of a completed module.

FIG. 3 depicts the lead frame unit after the insulator material has been applied. As shown in FIG. 3, gaps 11, 13, 15, 17 and 19 have been filled with the insulator material; portions of indentations 10b, 12b, 14b, 16b and 18b have also been filled. Rails 26, 27, 28 and 29 of insulator material have also been formed at the outermost edges of substrates. The insulator material has also been used to form registration members 30 which are used to align the reflector unit, as best shown in FIG. 6.

The insulator material is preferably applied by placing the lead frame unit (FIG. 2) in a mold, and injection molding the insulator material around the lead frame unit. One particularly suitable thermoplastic material that may be used as the insulator material is known as acrylonitrile-butadiene-styrene, or ABS. This material may be glass-filled, and is supplied by a number of manufacturers including GE Plastics of Pittsfield, Md. and by Monsanto.

After the molding step, the unit depicted in FIG. 3 is approximately 1 centimeter wide, 5 centimeters long, and 2.5 centimeters high. These dimensions were chosen such that the completed array (FIG. 8) will have an optoelectronic device every centimeter in both planar directions, thereby yielding sufficient power output for plant growth. By way of example, the array depicted in FIG. 8 may be composed of one-half red light emitting diodes (LEDs) and one-half blue LEDs. The output of the blue LEDs is approximately 50 micromoles per meter squared per second, with wavelengths in the range of 400 to 500 nanometers. The red LEDs have an output of approximately 500 micromoles per meter squared per second, with wavelengths in the range of about 640 to 700 nanometers. Thus, the total array has an output of approximately 550 micromoles per meter squared per second if the LEDs are one centimeter apart from each other. In a preferred embodiment, each modular unit would have LEDs of all the same type, red or blue. Modules of different types would be connected together to yield the desired output in the desired wavelengths. Of course, the LEDs in the resultant array could all be of the same type, or the array could be comprised of different proportions of the red and blue devices.

Figure 4:
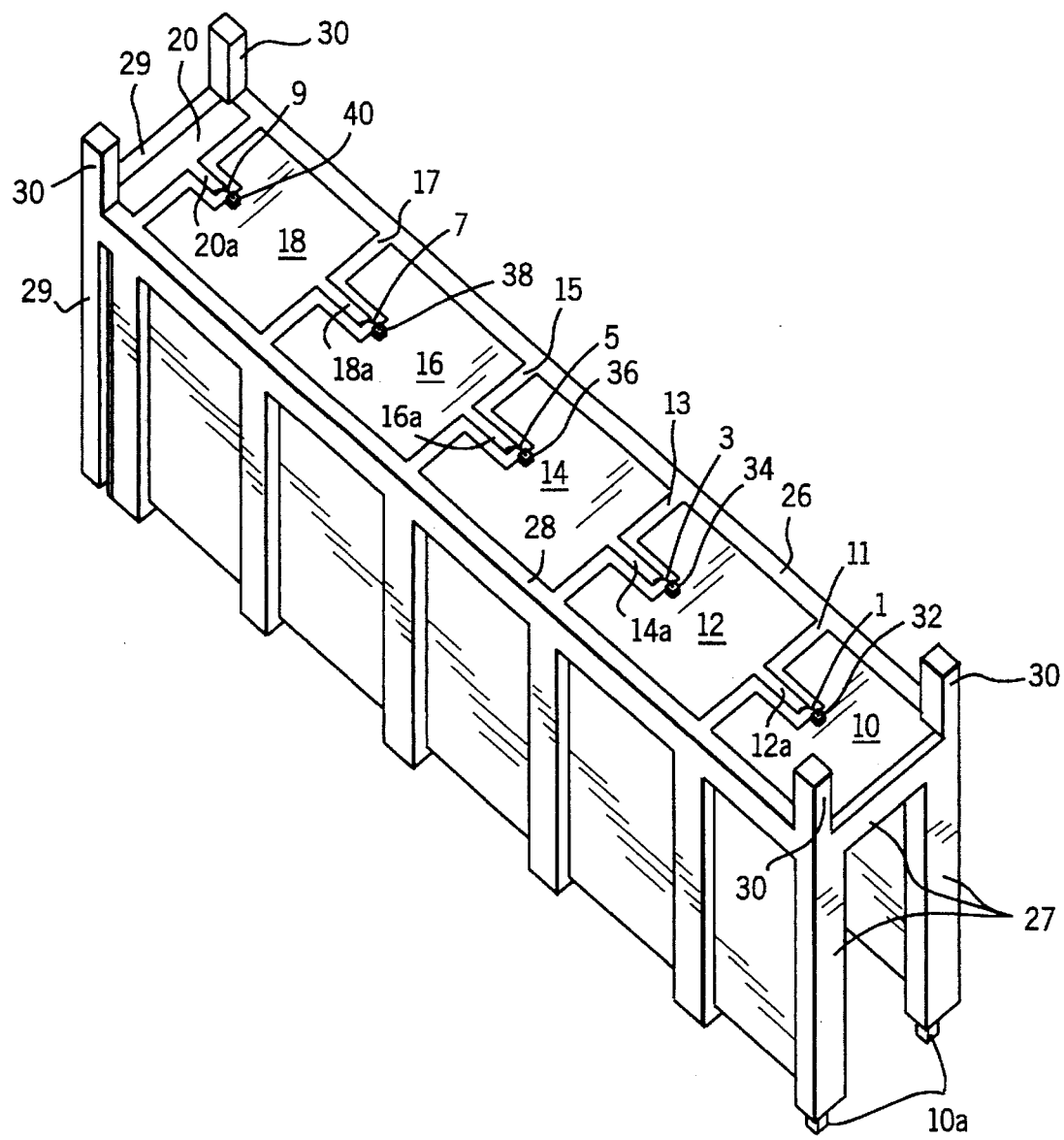
FIG. 4 is a perspective view of the lead frame unit after the optoelectronic devices have been affixed thereto.

The next step in the manufacturing process is to attach the individual optoelectronic devices to the module. As discussed in U.S. Pat. No. 5,278,432 issued Jan. 11, 1994 to Ignatius et al, which is incorporated by reference herein, the red optoelectronic devices may be GaAlAs LEDs manufactured by Mitsubishi Kaisi Polytech of Japan, and are available from Showa Denkoa or Stanley, both of Japan, or from Hewlett-Packard of Palo Alto, Calif. The blue optoelectronic devices may be silicon carbide LEDs sold by Cree Research Inc. of Durham, N.C. The LEDs are preferably epitaxially-formed, double heterojunction, double power diodes that emit substantially monochromatic light. These LEDs have one electrode disposed at the bottom of the optoelectronic device, which must be electrically bonded to the lead frame substrate. The positions of optoelectronic devices 32, 34, 36, 38 and 40 on substrates 10, 12, 14, 16 and 18 respectively are depicted in FIG. 4.

One way of bonding optoelectronic devices 32, 34, 36, 38 and 40 to the substrates is to use an electrically-conductive epoxy resin. One suitable conductive epoxy is made by Ablestik of Rancho Dominquez, Calif. and sold under the trademark ABLEBOND, Type No. 84-1LMIT. However, a preferred way of attaching the devices, to the lead frame substrates is by eutectic bonding using a metallic alloy such as an indium, lead or tin alloy. In the eutectic bonding step, the metallic alloy is melted between the LED electrode and the lead frame substrate, resulting in a much lower thermal resistance than if the electrically-conductive epoxy is used in the bond. A lower thermal resistance is highly desirable since a lower resistance will result in greater heat dissipation from the optoelectronic devices through the heat sink, consisting of the lead frame substrates. Another advantage of the lower thermal resistance achieved using eutectic bonding is that the greater heat dissipation allows the LEDs to be driven beyond their typical or rated forward currents. This feature increases the total radiant flux output by the LED array with fewer LED components.

The next step in attaching the optoelectronic devices to the substrates is to attach a lead wire from the other device electrode, located at the top of the device, to the protrusion portion of the adjacent substrate. In FIG. 4, a lead wire 1 is attached from an electrode of a device 32 to protrusion 12a of substrate 12. Similarly, a lead wire 3 is attached between device 34 and protrusion 14a, a lead wire 5 is attached between device 38 and protrusion 18a, and a lead wire 7 is attached between device 40 and protrusion 20a.

The lead wire is preferably aluminum or gold, and may be affixed by ultrasonic bonding at both ends. If the lead wire is gold, thermosonic bonding may be used in which the wire is first heated and then ultrasonically bonded to the optoelectronic device and the adjacent substrate.

After the optoelectronic devices have been electrically connected to the substrates, an overcoat of a transparent passivation epoxy is applied over the optoelectronic devices and their lead wires to protect the devices from the environment.

Figure 5:
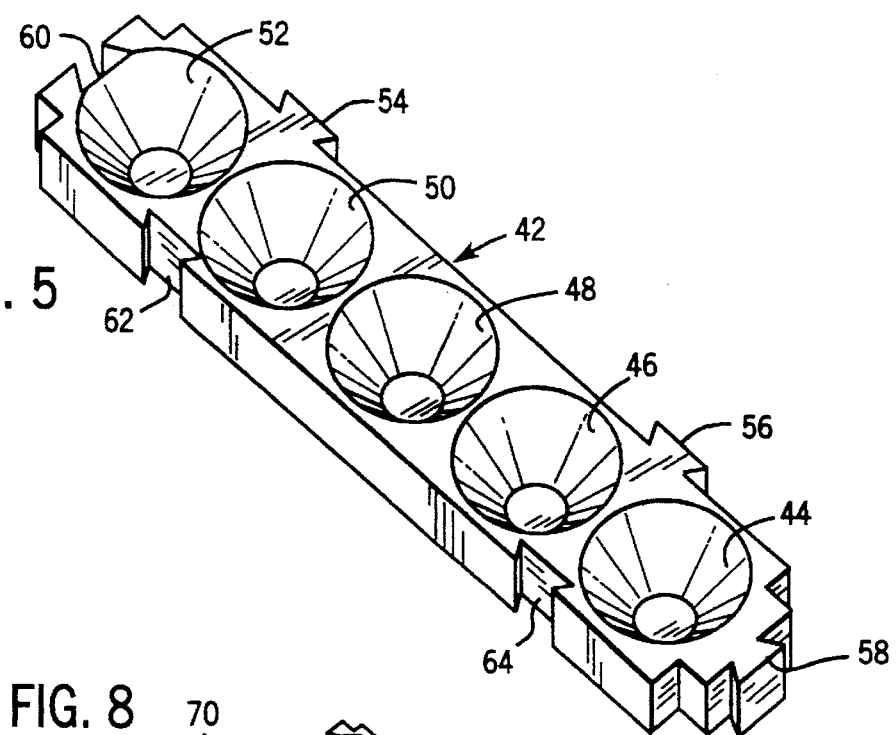
FIG. 5 is a perspective view of a reflector unit.

The next step in the process is to manufacture a reflector unit like reflector unit 42 depicted in FIG. 5. Referring to FIG. 5, reflector unit 42 is manufactured using standard injection molding techniques. The reflector unit contains a plurality of reflectors 44, 46, 48, 50 and 52, one reflector for each of optoelectronic optoelectronic devices 32, 34, 36, 38 and 40 respectively (FIG. 4). Reflector unit 42 is manufactured from the insulator material called ABS, discussed above. This material is particularly suitable for electroplating, since the reflective material is then electroplated or otherwise applied onto each of reflectors 44, 46, 48, 50 and 52. The reflector material is preferably chromium.

Reflectors 44, 46, 48, 50 and 52 are cone-shaped, and may be 30° cones for environmental chambers used to grow plants. Of course, other types of cones or other types of reflectors altogether may be used; the shapes of the reflectors are chosen as a function of the desired output beam profile from the optoelectronic devices.

Reflector unit 42 has a plurality of connectors affixed thereto for connecting the reflector unit to adjacent reflector units of adjacent modules. In FIG. 5, reflector unit 42 has a plurality of male-type connectors 54, 56, and 58, as well as a plurality of female-type connectors 60, 62, and 64. The connectors 54, 56, 58, 60, 62 and 64 preferably dovetail-shaped, although other shapes may also be used.

If the optional reflector units are not used, the connectors could be affixed to the lead frame unit, or could be injection molded onto the lead frame substrates along with the insulator material.

The next step in the manufacturing process is to complete each module by affixing the reflector units onto their respective lead frame units. A completed module is depicted in FIG. 6. In FIG. 6, reflector unit 42 is aligned on the lead frame unit by registration members 30. After being placed on the lead frame unit, reflector unit 42 is affixed to the lead frame unit by an adhesive such as an epoxy, or by a double-sided tape.

Figure 7:
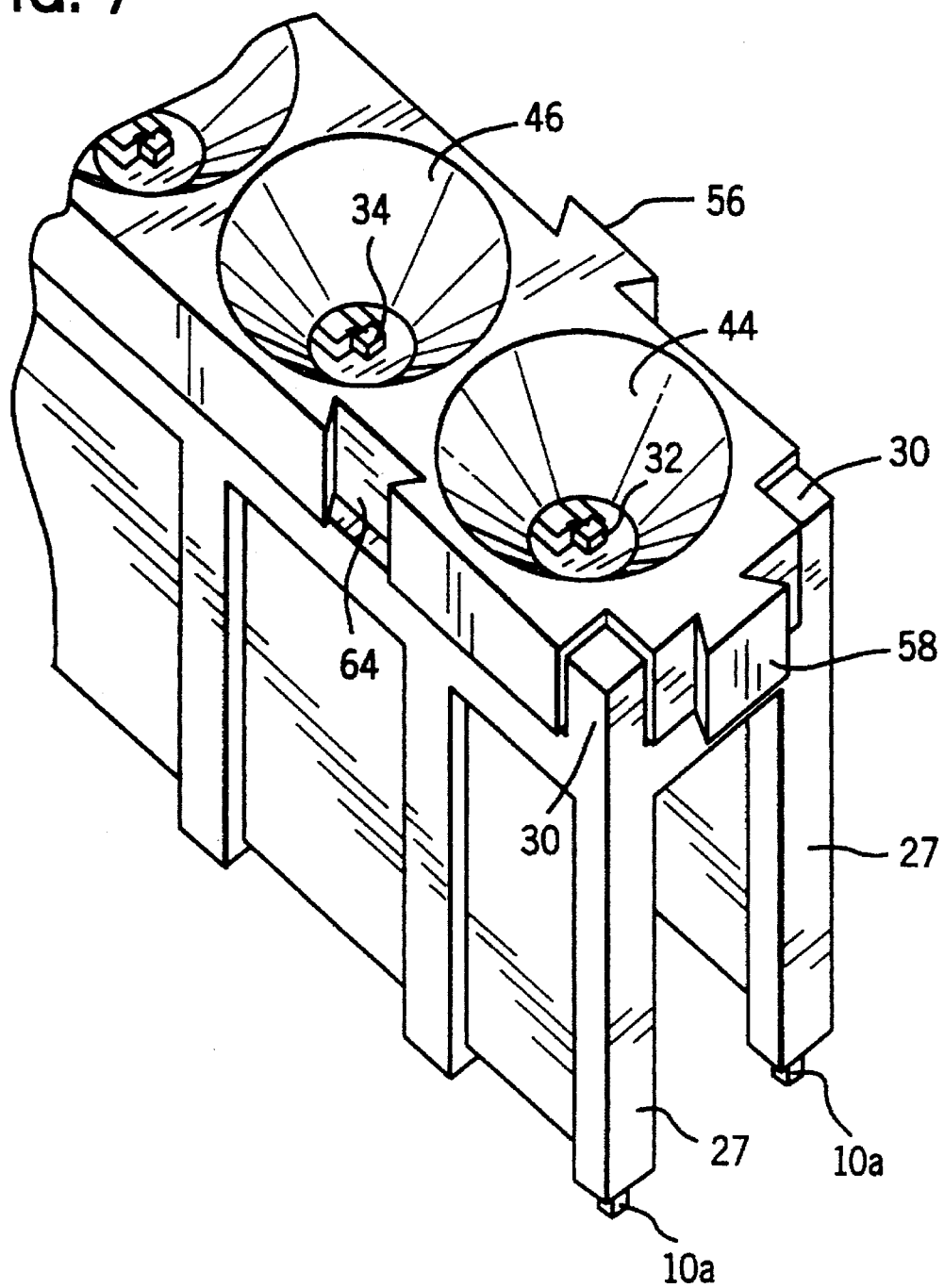
FIG. 7 is an exploded view of a portion of the module of FIG. 6.

As depicted in FIG. 6, each of the reflectors is disposed adjacent to an optoelectronic device. That is, reflector 44 is disposed adjacent device 32, reflector 46 is disposed adjacent device 34, reflector 48 is adjacent device 36, reflector 50 is adjacent device 38, and reflector 52 is disposed adjacent device 40. FIG. 7 is an exploded view which more clearly depicts the orientation of the reflectors with respect to their respective optoelectronic devices.

Figure 8:
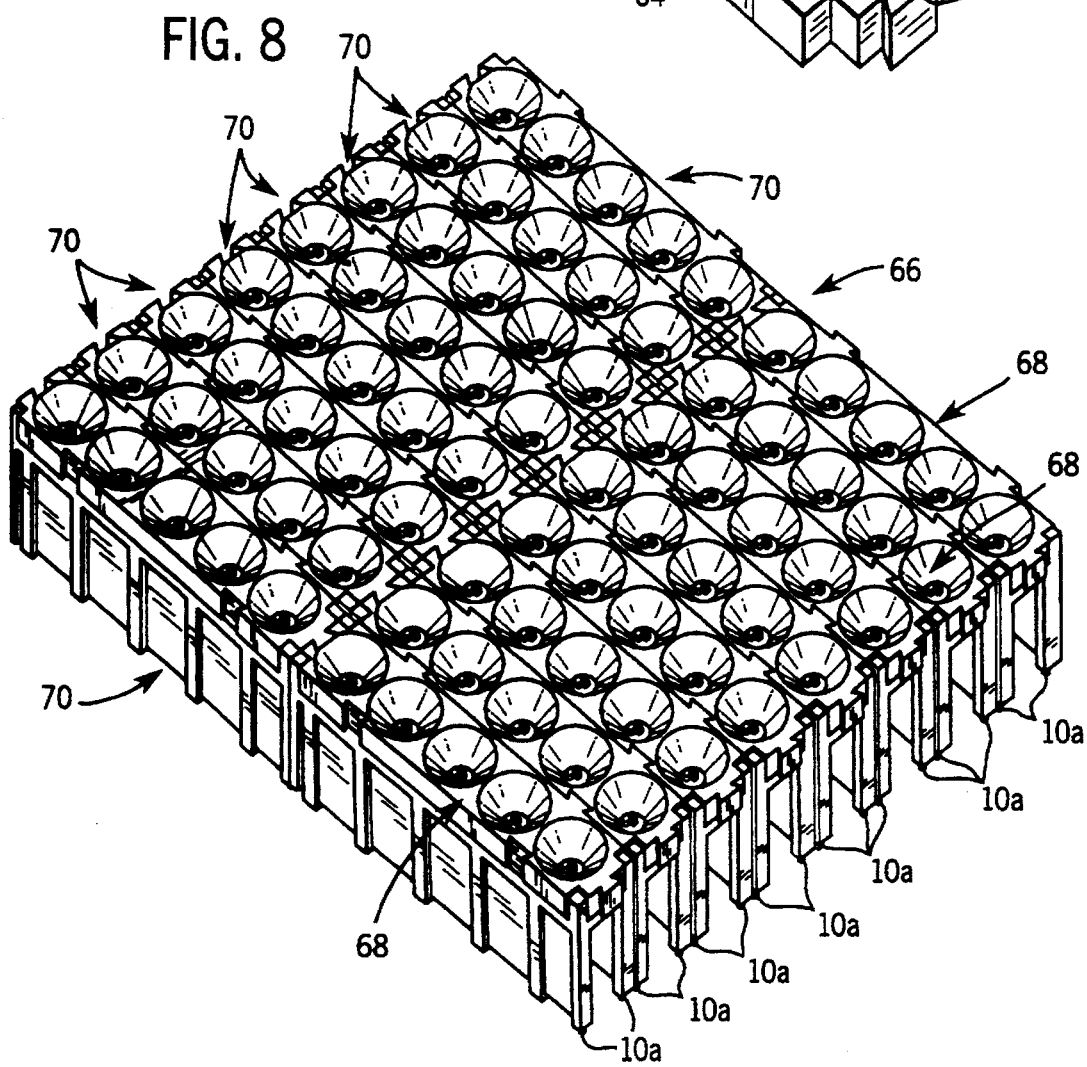
FIG. 8 is a perspective view of a complete array of optoelectronic devices.

After a number of modules have been completed, they are snapped together into an array, as depicted in FIG. 8. The modules are held together by the male and female-type connectors on their respective reflector units. The positioning of the connectors on each of the four sides of the reflector unit allows a wide variety of configurations for the completed array. For example, the array may be an 8×10 rectangular array 66 as depicted in FIG. 8. However, the array may also be configured to fit into a housing having a different shape, or may be used without a housing altogether. The U-shape of each of the lead frame substrates provides a great deal of surface area for heat dissipation without the need for an additional cooling apparatus in many applications, so that no surrounding housing may be needed.

To complete the entire assembly, a continuously variable power supply is connected to power the array. For the configuration in FIG. 8 and assuming that the modules are connected such that there are eight parallel strings of ten optoelectronic devices in each string, a continuously variable power supply may be used like that described in U.S. Pat. No. 5,278,432 issued Jan. 11, 1994 to Ignatius et al and incorporated by reference herein, except that the power supply should have a 24 volt output.

If it is assumed that array 66 in FIG. 8 is comprised of eight parallel strings of ten devices in each string, then each of electrical terminals 10a of module 68 will be connected to the power supply. Output terminals 20b (FIG. 2) of each of module 68 will be electrically connected by wires or otherwise to the input terminals of modules 70, so that each of the eight parallel strings will consist of a module 68 and a module 70 connected in series. Each of module 68 is also mechanically connected to one or more adjacent modules 68 and one module 70 using the connectors discussed above in connection with FIG. 6.

While a preferred embodiment of the present invention has been shown and described, alternate embodiments will be apparent to those skilled in the art and are within the intended scope of the present invention. Therefore, the invention is to be limited only by the following claims.

We claim:

1. A module having at least one optoelectronic device, comprising:

at least one electrically and thermally conductive lead frame substrate having an upper surface and being adapted to act as a heat sink;

at least one optoelectronic device electrically connected to said upper surface of said lead frame substrate; and at least one connector interconnected with said lead frame substrate that is adapted to interconnect said lead frame substrate with at least one other lead frame substrate of another module.

2. The module of claim 1, wherein said at least one lead frame substrate comprises a plurality of lead frame substrates separated and held together by an insulator material.

3. The module of claim 2, wherein at least one of said lead frame substrates has an input electrical terminal, and wherein another of said lead frame substrates has an output electrical terminal.

4. The module of claim 3, wherein said optoelectronic device has a rated forward current associated therewith, and wherein said input electrical terminal receives an amount of current that exceeds the rated forward current of said optoelectronic device.

5. The module of claim 2, wherein at least some of said lead frame substrates have an optoelectronic device affixed thereto, and wherein each optoelectronic device is also electrically connected to another lead frame substrate in said module.

6. The module of claim 1, further comprising:
a reflector unit, having at least one reflector, affixed to said lead frame substrate such that said reflector is adjacent to said optoelectronic device.

7. The module of claim 6, wherein said reflector unit includes a plurality of reflectors, each of said reflectors having a coating of a reflective material.

8. The module of claim 6, wherein said at least one connector is affixed to said reflector unit.

9. The module of claim 8, wherein said reflector unit has a male connector and a female connector that are adapted to connect said reflector unit with a reflector unit of another module.

10. The module of claim 1, wherein said optoelectronic device is a light emitting diode.

11. The module of claim 1, wherein said lead frame substrate is U-shaped in cross-section.

12. The module of claim 1, wherein at least a portion of the lead frame substrate to which an optoelectronic device is affixed is coated with a metal.

13. An array of optoelectronic devices, comprising: a plurality of modules of optoelectronic devices, each of said modules including
a plurality of electrically and thermally conductive lead frame substrates, each of said substrates being adapted to act as a heat sink, at least one of said substrates having an input electrical terminal and at least one other substrate having an output electrical terminal;
an optoelectronic device electrically connected to at least some of said lead frame substrates; means for mechanically connecting two of said modules together; and
means for electrically connecting an input terminal of one of said modules to an output terminal of another module.

14. The array of claim 13, wherein each of said optoelectronic devices has a rated forward current associated therewith, and wherein said input electrical terminal receives an amount of current that exceeds the rated forward current of said optoelectronic devices.

15. The array of claim 13, wherein each module also includes:
a reflector unit interconnected with said lead frame substrates and having a plurality of reflectors thereon, each of said reflectors being adjacent to an optoelectronic device.

16. The array of claim 15, wherein each of said modules includes at least two registration members that are used to align said reflector unit.

17. The array of claim 13, wherein the lead frame substrates in each module are held together by an insulator material.

18. The array of claim 13, wherein said lead frame substrates are U-shaped in cross-section.

19. The array of claim 13, wherein each optoelectronic device is also electrically connected to an adjacent lead frame substrate.

20. The array of claim 13, wherein said mechanically connecting means comprises:
at least one male connector interconnected with each module; and
at least one female connector interconnected with each module.

21. The array of claim 13, wherein said electrical connecting means comprises a lead wire connected between an input terminal of a module and an output terminal of another module.

22. A method of manufacturing a module having at least one optoelectronic device, comprising;
forming at least one lead frame substrate;
applying an insulator material onto portions of said lead frame substrate to create a lead frame unit;
affixing said at least one optoelectronic device onto said lead frame unit; and
forming at least one connector that connects said module to an adjacent module.

23. The method of claim 22, wherein said lead frame forming step includes:
creating a lead frame substrate; and
bending said lead frame substrate into a U-shape.

24. The method of claim 22, wherein said insulator applying step includes:
placing said at least one lead frame substrate into a mold; and
molding a thermoplastic insulator material onto portions of said lead frame substrate.

25. The method of claim 22, wherein said device affixing step includes:
bonding an optoelectronic device onto said lead frame substrate; and
affixing a lead wire between said bonded optoelectronic device and another lead frame substrate.

26. The method of claim 22, further comprising:
coating said optoelectronic device with a transparent protective layer.

27. The method of claim 22, wherein lead frame forming step includes:
forming at least one electrical terminal on said lead frame substrate.

28. The method of claim 22, further comprising:
forming a reflector unit having at least one reflector; and
affixing said reflector unit to said lead frame unit such that said at least one reflector is disposed adjacent to said at least one optoelectronic device.

29. The method of claim 28, wherein said reflector unit forming step includes:
applying a layer of a reflective material onto said reflector.

30. The method of claim 28, wherein said reflector unit forming step includes:
forming a plurality of connectors on said reflector unit such that each of said connectors may be connected with an adjacent reflector unit.

31. The method of claim 28, wherein said reflector unit affixing step includes:
bonding said reflector unit onto an upper surface of said lead frame unit.

32. The method of claim 28, further comprising:
forming at least two registration members on said lead frame unit that are used to align said reflector unit with said lead frame unit.

33. A method of manufacturing an array of optoelectronic devices, comprising:
creating a plurality of modules of optoelectronic devices, each of said modules being created by
forming a plurality of lead frame substrates such that at least one of said substrates has an input electrical terminal and at least one of said lead frame substrates has an output electrical terminal;

applying an insulator material onto portions of said lead frame substrates to create a unit of spaced lead frame substrates;

forming at least one connector that is interconnected with said lead frame unit;

mechanically connecting said at least one connector on each module with a connector of another module; and electrically connecting the output electrical terminal of at least one of said modules with the input electrical terminal of another module.

34. The method of claim 33, further comprising:

electrically connecting the input terminal of at least one of said modules with a power supply.

35. The method of claim 33, wherein said module creating step further comprises:

forming a reflector unit having a plurality of reflectors; and affixing said reflector unit to said unit of spaced lead frame substrates such that a reflector is disposed adjacent to each of said optoelectronic devices.

36. The method of claim 35, wherein said reflector unit forming step includes:

forming at least one male connector on each reflector unit; and forming at least one female connector on each reflector unit.

37. The method of claim 33, wherein said electrically connecting step includes:

affixing a lead wire between the output electrical terminal of at least one of said modules and the input electrical terminal on another module.

* * * * *